(12) United States Patent
Kim et al.

(10) Patent No.: US 7,489,368 B2
(45) Date of Patent: Feb. 10, 2009

(54) THIN FILM TRANSISTOR DEVICE, LIQUID CRYSTAL DISPLAY DEVICE USING THE SAME, AND METHOD OF FABRICATING THE SAME

(75) Inventors: Jong Il Kim, Kyonggi-do (KR); Seung Hee Nam, Kyonggi-do (KR); Jae Young Oh, Kyonggi-do (KR)

(73) Assignee: LG Display Co., Ltd., Seoul (KR)

( * ) Notice: Subject to any disclaimer, the term of this patent is extended or adjusted under 35 U.S.C. 154(b) by 118 days.

(21) Appl. No.: 10/880,121

(22) Filed: Jun. 30, 2004

(65) Prior Publication Data
US 2005/0140890 A1    Jun. 30, 2005

(30) Foreign Application Priority Data
Dec. 30, 2003    (KR) ............... 10-2003-0100056

(51) Int. Cl.
G02F 1/136    (2006.01)
(52) U.S. Cl. .................................. 349/43; 349/47
(58) Field of Classification Search ......... 349/187, 349/139, 43, 47
See application file for complete search history.

(56) References Cited

U.S. PATENT DOCUMENTS

| | | | |
|---|---|---|---|
| 4,770,498 A | * | 9/1988 | Aoki et al. ............ 349/47 |
| 5,242,543 A | | 9/1993 | Maejima et al. |
| 5,496,749 A | * | 3/1996 | Nasu et al. ............ 438/30 |
| 6,243,155 B1 | * | 6/2001 | Zhang et al. ........... 349/199 |
| 6,300,988 B1 | * | 10/2001 | Ishihara et al. ........ 349/43 |
| 6,821,811 B2 | * | 11/2004 | Hirakata et al. ....... 438/82 |
| 6,830,856 B2 | * | 12/2004 | Tsai et al. ............. 430/7 |
| 7,046,282 B1 | * | 5/2006 | Zhang et al. .......... 348/294 |
| 7,102,722 B2 | * | 9/2006 | Kim et al. ............ 349/155 |
| 2001/0004280 A1 | * | 6/2001 | Kim et al. ............ 349/187 |
| 2004/0155992 A1 | * | 8/2004 | Choi .................... 349/43 |

FOREIGN PATENT DOCUMENTS

| | | |
|---|---|---|
| CN | 1364323 | 8/2002 |
| JP | 06-160907 | 6/1994 |
| JP | 2003-158134 | 5/2003 |
| WO | WO 00/79617 A1 | 12/2000 |

* cited by examiner

*Primary Examiner*—James A Dudek
(74) *Attorney, Agent, or Firm*—McKenna Long & Aldridge LLP

(57) ABSTRACT

A liquid crystal display device includes a data line, a source electrode, a drain electrode, and a pixel electrode disposed on a lower substrate, an island-shaped semiconductor layer overlapping the source and drain electrodes, a gate insulating layer along an entire surface of the lower substrate including the semiconductor layer, a gate line and a gate electrode on the gate insulating layer, a passivation layer along an entire surface of the lower substrate including the gate line, an upper substrate facing the lower substrate, and a liquid crystal layer between the lower and upper substrates.

25 Claims, 25 Drawing Sheets organic TFT organic TFT organic TFT

THIN FILM TRANSISTOR DEVICE, LIQUID CRYSTAL DISPLAY DEVICE USING THE SAME, AND METHOD OF FABRICATING THE SAME

The present invention claims the benefit of Korean Patent Application No. P2003-100056, filed in Korea on Dec. 30, 2003, which is hereby incorporated by reference.

BACKGROUND OF THE INVENTION

1. Field of the Invention

The present invention relates to a transistor device, display device, and a method of fabricating a display device, and more particularly, to a thin film transistor device, a liquid crystal display (LCD) device, and a method of fabricating an LCD device.

2. Discussion of the Related Art

In general, an LCD device comprises a thin film transistor (TFT) array substrate, an opposing substrate, and a liquid crystal layer between the TFT array and opposing substrates. The TFT array substrate includes TFTs used as switching devices in the LCD device. The TFTs are generally used in active matrix type liquid crystal display (AMLCD) devices for laptop computers. In the AMLCD device, each of the TFTs is formed at a crossing point of gate and data lines, wherein the gate and data lines cross each other to define a plurality of pixel regions. Accordingly, the TFTs function as switches for turning ON or OFF a current to the pixel region. More specifically, in the turning ON state, a capacitor of the pixel region is charged to a predetermined voltage level by the current. Meanwhile, in the turning OFF state, the pixel region is maintained as the charged state until the unit pixel region is addressed to a next state. In this state, the voltage level determines light transmittance through liquid crystal corresponding to the unit pixel region, thereby determining a gray level.

FIGS. 1A to 1G are plan and cross sectional views of a fabrication process of a TFT array substrate according to the related art. In FIG. 1A, a plurality of gate lines 12 and gate electrodes 12a are formed on a lower substrate by a photolithographic process that includes deposition of a metal layer having low resistance on a transparent glass substrate having great heat-resistance at a high temperature, and deposition of a photoresist thereupon. Then, a mask having a predetermined pattern is positioned on the photoresist, and light is selectively irradiated thereto, thereby forming the same pattern as that of the mask on the photoresist. Next, some portions of the photoresist irradiated with light are removed and patterned by using an etchant, and the metal layer having no photoresist thereon is etched, thereby obtaining a desired pattern of the photoresist. For example, the etching method is classified into a dry-etching method using plasma, and a wet-etching method using chemical solution.

In FIGS. 1B and 1C, an inorganic layer of silicon nitride $SiN_x$ or silicon oxide $SiO_x$ is deposited along an entire surface of the lower substrate 11 including the gate line 12 at a high temperature, thereby forming a gate insulating layer 13. Subsequently, an island-shaped semiconductor layer 14 is formed on the gate insulating layer 13 above the gate electrode 12a. At this time, the semiconductor layer 14 is formed in a method of depositing an amorphous silicon (a-Si:H) at a high temperature and patterning the amorphous silicon by photolithography.

In FIGS. 1D and 1E, a metal layer is deposited along an entire surface of the lower substrate 11 including the semiconductor layer 14, and patterned by a photolithographic process, thereby forming a data line layer. The data line layer includes a data line 15 perpendicular to the gate line 12 to define a pixel region, and source and drain electrodes 15a and 15b overlap with both sides of the semiconductor layer 14. At this time, the gate line 12, the gate electrode 12a, the data line 15, and the source and drain electrodes 15a and 15b are formed of a low-resistance metal material, such as aluminum Al, aluminum neodymium AlNd, molybdenum Mo or chrome Cr. The deposited gate electrode 12a, the gate insulating layer 13, the semiconductor layer 14, and the source and drain electrodes 15a and 15b form a thin film transistor.

In FIGS. 1F and 1G, an organic insulating layer of BCB (BenzoCycloButene) is deposited along an entire surface of the lower substrate 11 including the data line 15, thereby forming a passivation layer 16. Then, the passivation layer 16 is selectively removed, so that it is possible to form a contact hole exposing the drain electrode 15b. Next, a transparent conductive layer of ITO (Indium-Tin-Oxide) or IZO (Indium-Zinc-Oxide) is formed along an entire surface of the lower substrate 11 including the passivation layer 16, and then patterned by a photolithographic process, to form a pixel electrode 17 contacting the drain electrode 15b in the pixel region, thereby completing the TFT array substrate.

FIG. 2 is a cross sectional view of an LCD device according to the related art. In FIG. 2, the lower substrate 11 having the TFT is bonded to an upper substrate 21. The upper substrate 21 includes an R/G/B color filter layer 23 corresponding to the pixel regions to display various colors, a black matrix layer 22 that excludes light leakage in the portions defining the pixel regions, and a common electrode 24 opposite to the pixel electrode. Like the lower substrate 11, the upper substrate 21 is formed of the transparent glass substrate having great heat-resistance, since the process of forming the pattern is carried out at the high temperature.

Although not shown, ball spacers (not shown) of plastic or silica, each having a predetermined diameter, are uniformly formed between the lower and upper substrates 11 and 21, to maintain a cell gap between the two substrates 11 and 21. In addition, a sealant (not shown) is printed along a circumference of an active region to prevent liquid crystal material from leaking, and to bond the two substrates together. For example, the sealant is printed with a screen mask having a predetermined pattern, wherein the sealant is not printed in the portion corresponding to an inlet through which liquid crystal material is injected. Then, the inside of the two substrates is maintained in the vacuum state, and the liquid crystal material is injected between the two substrates 11 and 21 by using a capillary phenomenon and a pressure difference, thereby forming a liquid crystal layer 31. Thereafter, the inlet is sealed, so that it is possible to complete the LCD device.

In order to form the aforementioned LCD device, the process must be performed at a temperature between 250° C. to 400° C. For example, the gate insulating layer 13 and the semiconductor layer 14 are deposited using a plasma enhanced chemical vapor deposition (PECVD) method. In this case, the above-mentioned deposition process is carried out at a temperature 250° C. or more. Accordingly, a glass substrate having great heat-resistance is used for the LCD device. However, the glass substrate is heavy, requires the complicated fabrication process, and has low mobility.

To solve these problems, a flexible substrate has been actively studied to form a display device having lightness in weight, great shock absorption and flexibility. Recently, instead of the glass substrate for the LCD device, use of a plastic substrate is on an increasing trend. However, a coefficient of thermal expansion (CTE) of the plastic substrate is ten times as high as a CTE of the glass substrate, so that it requires a low temperature process, such as a process at below 150° C. or less. Thus, it is necessary to form the line layer, the semiconductor layer, and various insulating layers using organic material, since the organic material is suitable for the low temperature process.

According to the related art, 7 masks are required for forming the gate line layer, the semiconductor layer, the data line layer, the contact hole of the passivation layer, the pixel electrode, the black matrix layer, and the color filter layer. Thus, the fabrication process is complicated due to the increase of the number of masks. As a result, the fabrication efficiency deteriorates by the increase of fabrication cost and time.

SUMMARY OF THE INVENTION

Accordingly, the present invention is directed to a thin film transistor device, a liquid crystal display (LCD) device, and a method for fabricating the same that substantially obviates one or more problems due to limitations and disadvantages of the related art.

An object of the present invention is to provide a thin film transistor device having organic materials with improved adhesive bonding.

Another object of the present invention is to provide an LCD device having a plastic substrate.

Another object of the present invention is to provide a method of fabricating an LCD device using a plastic substrate. by carrying out the process for forming a semiconductor layer at a low temperature, and to obtain the simplified fabrication cost by forming an organic thin film transistor TFT in a low-mask technology to decrease the usage count of masks, thereby decreasing the fabrication cost.

Another object of the present invention is to provide an LCD device having an organic TFT.

Additional features and advantages of the invention will be set forth in part in the description which follows, and in part will be apparent from the description, or may be learned from practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described, a liquid crystal display device includes a data line, a source electrode, a drain electrode, and a pixel electrode disposed on a lower substrate, an island-shaped semiconductor layer overlapping the source and drain electrodes, a gate insulating layer along an entire surface of the lower substrate including the semiconductor layer, a gate line and a gate electrode on the gate insulating layer, a passivation layer along an entire surface of the lower substrate including the gate line, an upper substrate facing the lower substrate, and a liquid crystal layer between the lower and upper substrates.

In another aspect, a method of fabricating a liquid crystal display device includes forming a data line and a pixel electrode on a lower substrate, forming a semiconductor layer overlapping portions of the data line and the pixel electrode, forming a gate insulating layer along an entire surface of the lower substrate including the semiconductor layer, forming a gate line perpendicular to the data line on the gate insulating layer, forming a passivation layer along an entire surface of the lower substrate including the gate line, bonding the lower and upper substrates to each other, and forming a liquid crystal layer between the lower and upper substrates.

In another aspect, a method of fabricating a liquid crystal display device includes forming a data line and a pixel electrode on a lower substrate, forming an insulating layer between lateral portions of the data line and the pixel electrode, forming a semiconductor layer to overlap the data line and the pixel electrode, forming a gate insulating layer along an entire surface of the lower substrate including the semiconductor layer, forming a gate line perpendicular to the data line on the gate insulating layer, forming a passivation layer along an entire surface of the substrate including the gate line, bonding the lower substrate to an upper substrate, and forming a liquid crystal layer between the lower and upper substrates.

In another aspect, a thin film transistor device includes a substrate, a source electrode and a drain electrode on the substrate, an island-shaped semiconductor layer overlapping the source and drain electrodes, a gate insulating layer along an entire surface of the substrate including the semiconductor layer, a gate line and a gate electrode on the gate insulating layer, and a passivation layer along an entire surface of the substrate including the gate line.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1A:
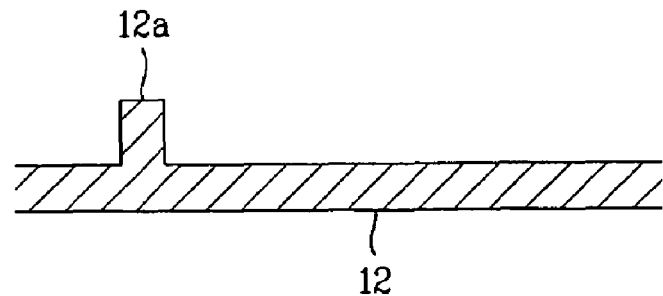
FIG. 1A is a plan view of gate line of a TFT array substrate according to the related art.
Figure 1B:
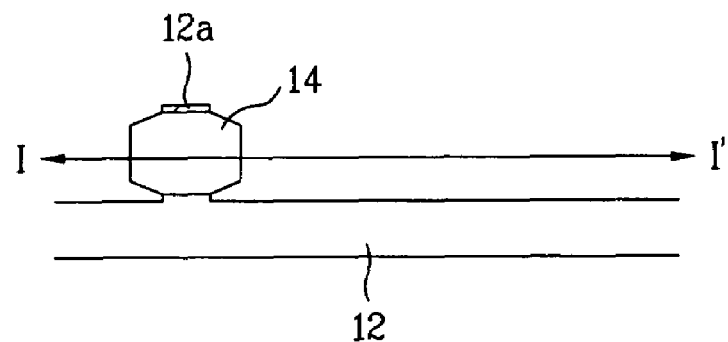
FIG. 1B is a plan view of a gate line of a TFT array substrate according to the related art.
Figure 1C:
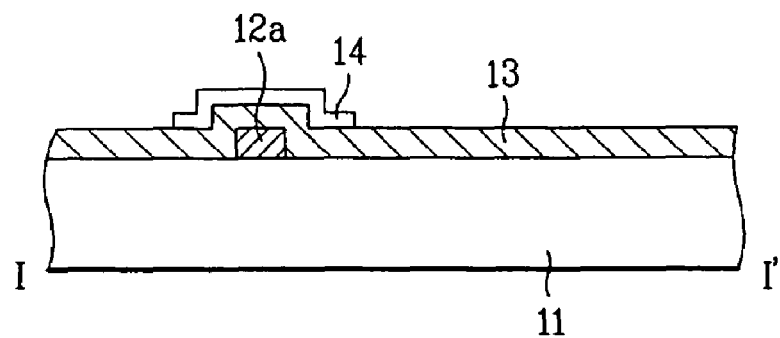
FIG. 1C is a cross sectional view along I-I' of FIG. 1B according to the related art.
Figure 1D:
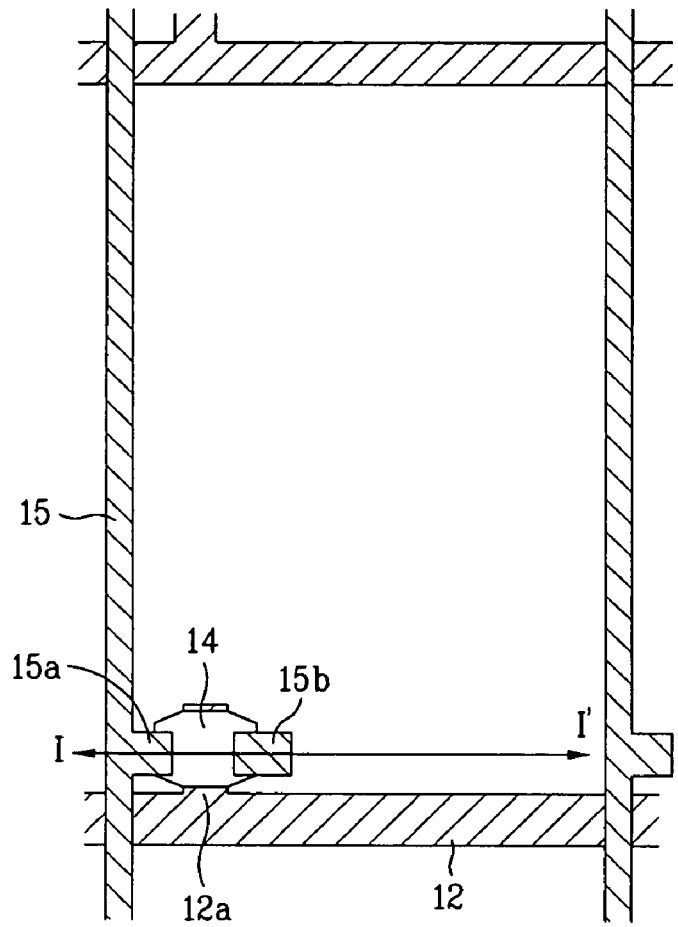
FIG. 1D is a plan view of a TFT array substrate according to the related art.
Figure 1E:
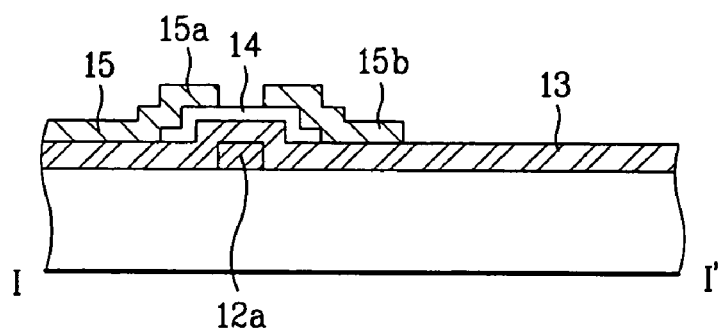
FIG. 1E is a cross sectional view along I-I' of FIG. 1D according to the related art.
Figure 1F:
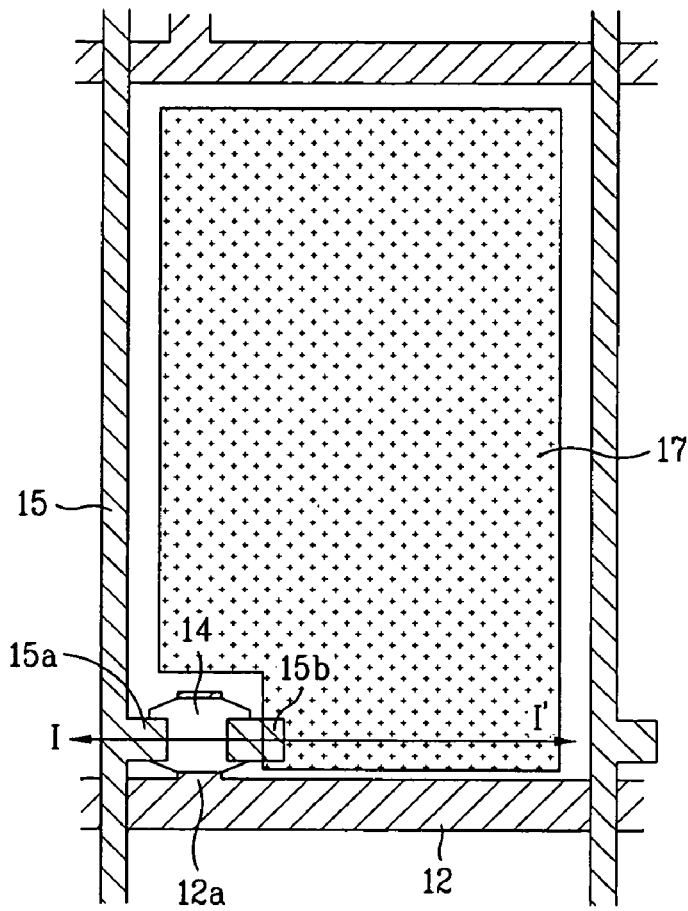
FIG. 1F is a plan view of a TFT array substrate according to the related art.
Figure 1G:
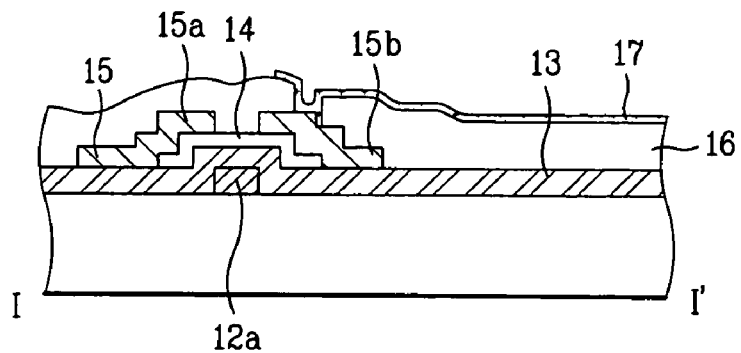
FIG. 1G is a cross sectional view along I-I' of FIG. 1F according to the related art.
Figure 2:
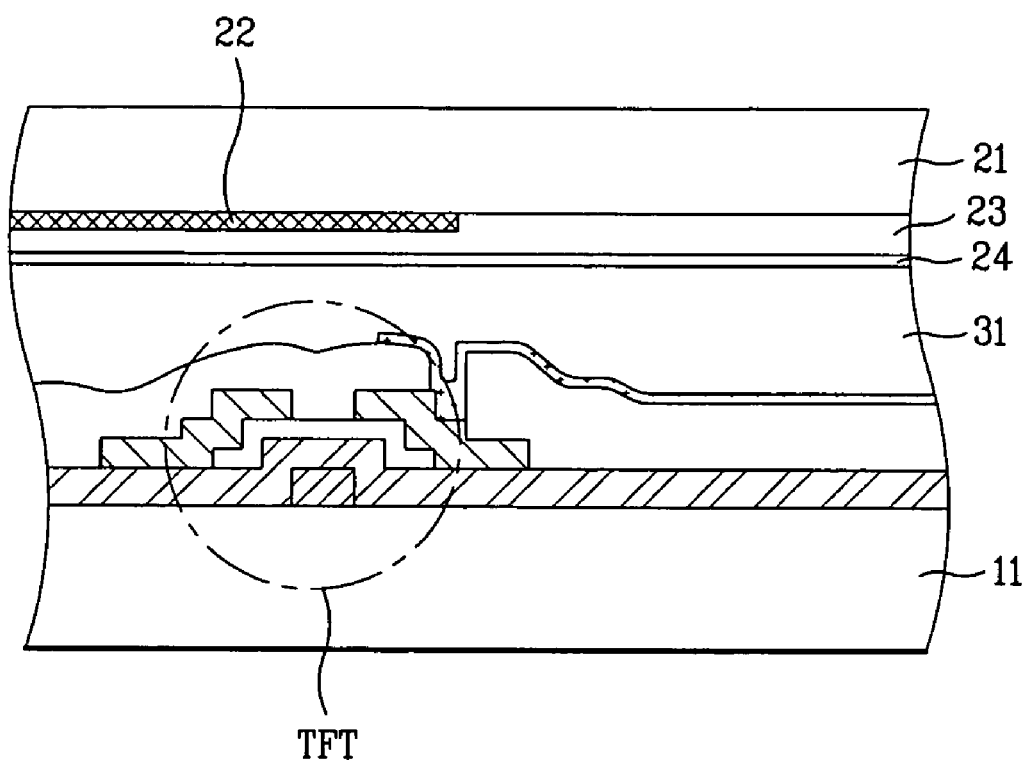
FIG. 2 is a cross sectional view of an LCD device according to the related art.
Figure 3A:
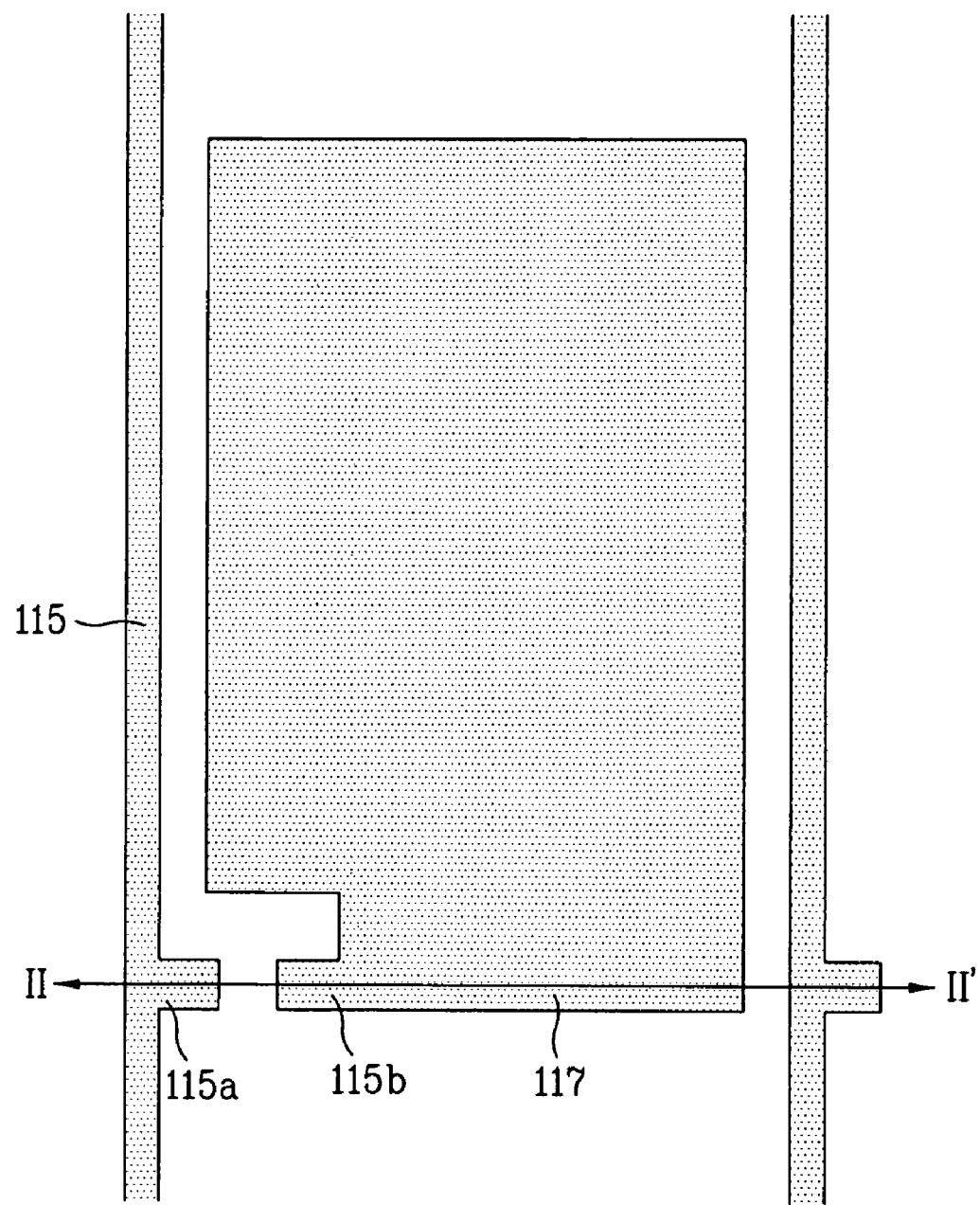
FIG. 3A is a plan view of an exemplary TFT array substrate according to the present invention.
Figure 3B:
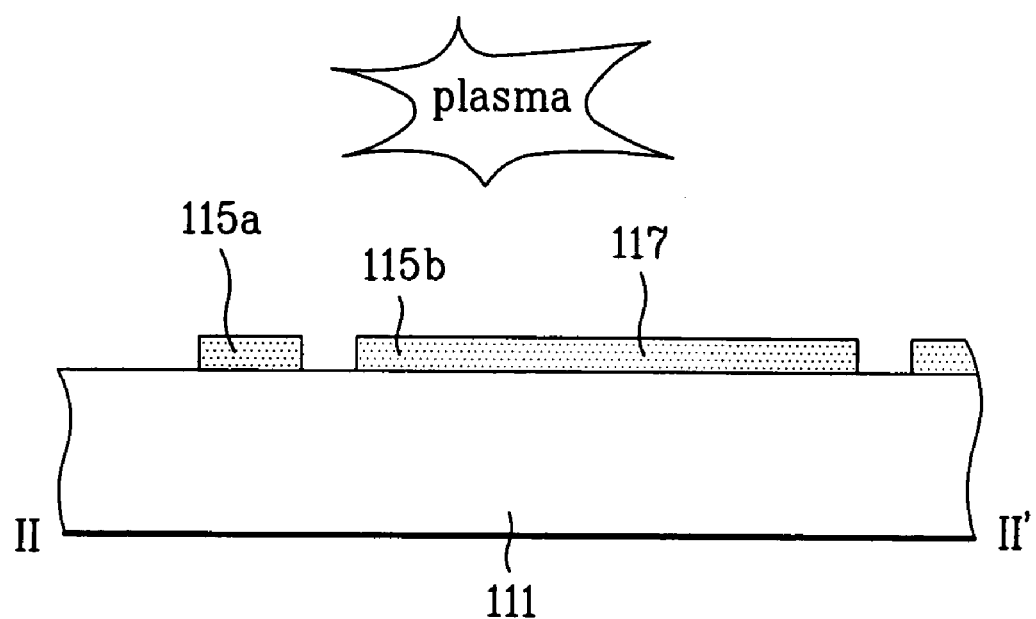
FIG. 3B is a cross sectional view along II-II' of FIG. 3A according to the present invention.

FIG. 3A to 3F are plan and cross sectional views of an exemplary method of fabricating a TFT array substrate according to the present invention. In FIGS. 3A and 3B, a transparent conductive material, such as indium-tin-oxide (ITO), may be deposited on a glass or transparent plastic lower substrate 111 in a vacuum state, and a photoresist (not shown) may be deposited thereon. After a mask having a predetermined pattern is positioned above the photoresist, UV rays or X-rays may be irradiated thereto, and the photoresist may be developed, thereby patterning the photoresist. Subsequently, the photoresist may undergo a bake process, an ion implantation process, and a UV curing process to obtain a cross-linked photoresist polymer having great dissolution-resistance.

Then, the exposed ITO layer may be selectively etched by using the patterned photoresist as a mask, thereby simultaneously forming a data line 115, a source electrode 115a, a drain electrode 115b, and a pixel electrode 117. Accordingly, the data line 115 may be formed with the source electrode 115a, and the pixel electrode 117 may be formed with the drain electrode 115b.

Then, surfaces of the data line 115, the source electrode 115a, the drain electrode 115b, and the pixel electrode 117 may undergo a plasma treatment, wherein the ITO layer may have hydrophilic/hydrophobic properties to organic materials. For example, a mixing gas of $CF_4$ or $O_2$ may be used for the plasma treatment. If the mixing gas has significant amounts of $O_2$, the hydrophilic properties of the ITO to the organic materials may increase. Conversely, if the mixing gas has significant amounts of $CF_4$, the ITO layer may have the hydrophobic properties to the organic materials. Accordingly, increasing amounts of the $O_2$ in the mixing gas may cause the ITO layer to have the hydrophilic properties to the organic materials.

As the plasma treatment is performed to the surface of the ITO layer, a work function of the ITO layer may be changed to control an adhesiveness to the organic material. In addition, cleaning the surface of the ITO layer may also increase a surface area of the ITO layer for chemical binding to the ITO layer.

Figure 3C:
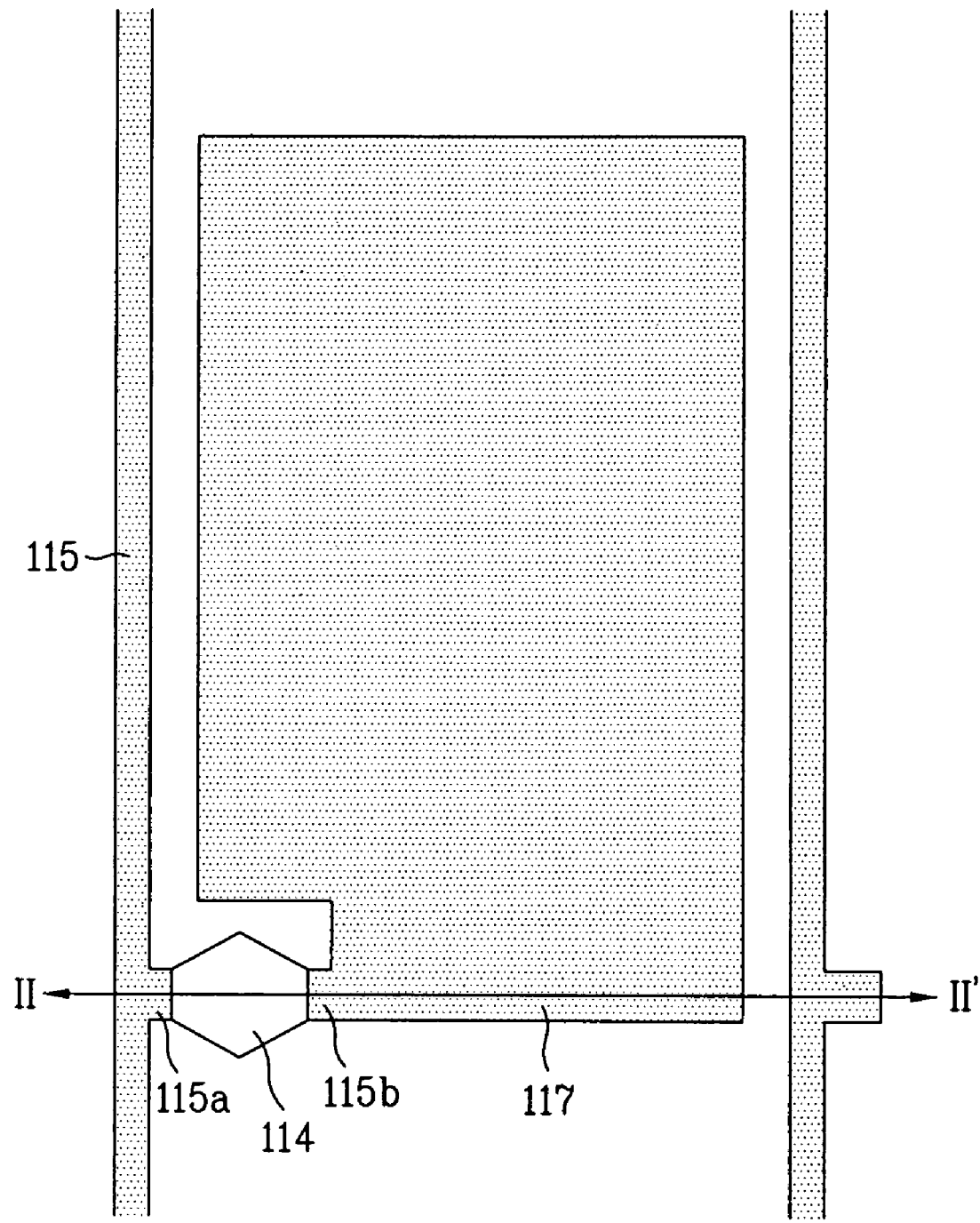
FIG. 3C is a plan view of an exemplary TFT array substrate according to the present invention.
Figure 3D:
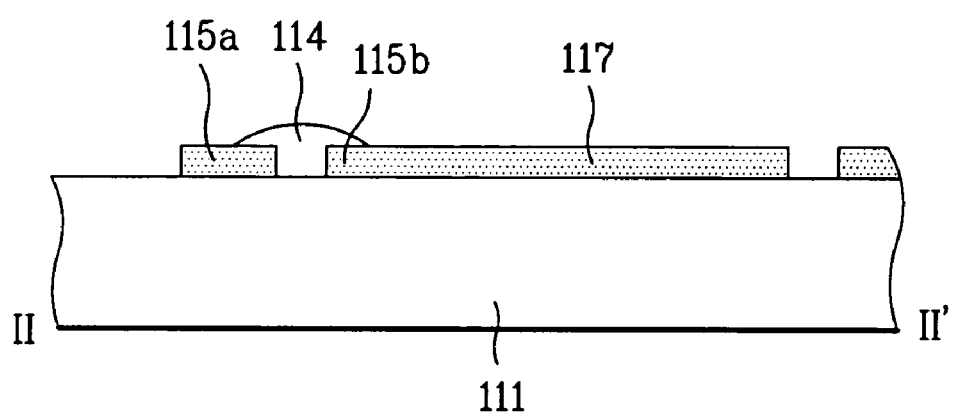
FIG. 3D is a cross sectional view along II-II' of FIG. 3C according to the present invention.

As shown in FIGS. 3C and 3D, after a screen mask, such as a metal mask, is positioned, the semiconductor layer 114 may be formed to overlap the source and drain electrodes 115a and 115b during a coating method. Alternatively, the semiconductor layer 114 may be formed using an inject-printing method. Accordingly, since the surfaces of the source and drain electrodes 115a and 115b may have the hydrophilic properties due to the plasma treatment, the semiconductor layer 114 may be easily adhered to the source and drain electrodes 115a and 115b. Thus, the semiconductor layer 114 may be formed using the coating method including the screen mask, or may be formed using the inject-printing method. In addition, the semiconductor layer 114 may be formed having an improved adhesiveness using low-temperature processes without the need for photolithographic process using a mask. For example, the screen mask may have open areas based upon a pattern of the semiconductor layer 114, and the semiconductor layer 114 may be formed of organic materials, such as LCPBC liquid crystalline polyfluorene block copolymer (LCPBC) or Pentacene.

Figure 3E:
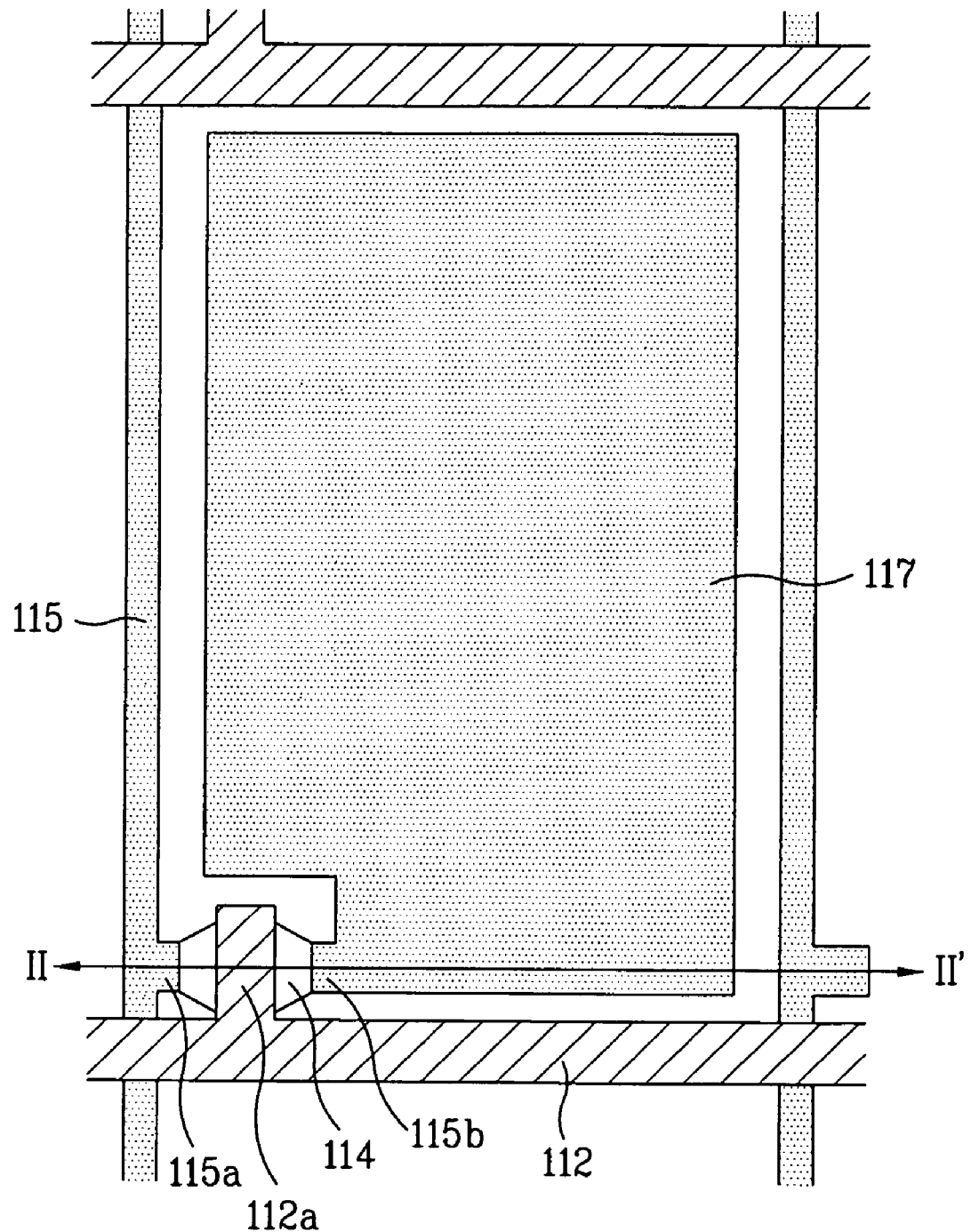
FIG. 3E is a plan view of an exemplary TFT array substrate according to the present invention.
Figure 3F:
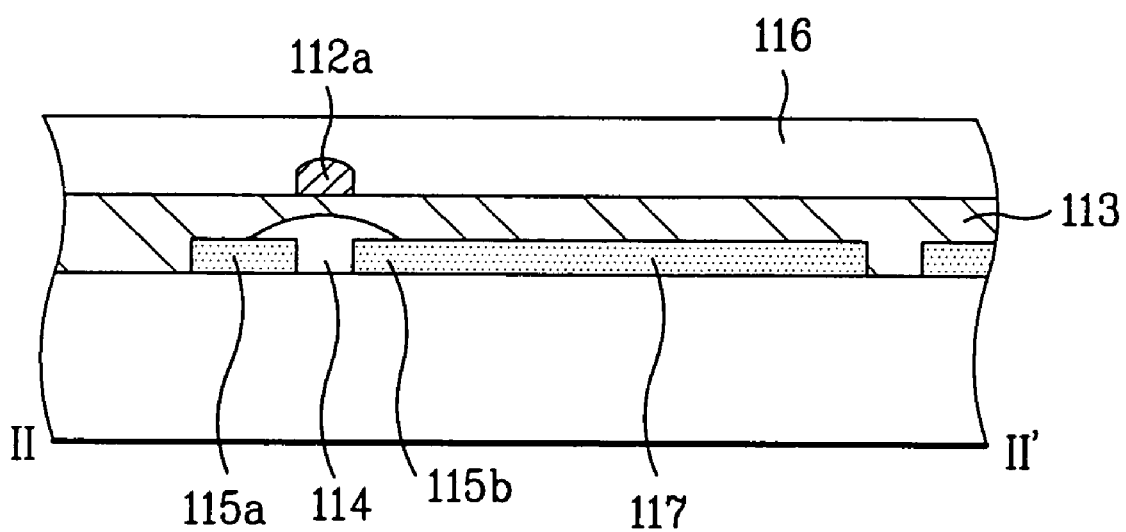
FIG. 3F is a cross sectional view along II-II' of FIG. 3E according to the present invention.

In FIGS. 3E and 3F, an organic material such as BCB or acrylic material, may be deposited along an entire surface of the substrate 111 including the semiconductor layer 114 using a low temperature process, thereby forming the gate insulating layer 113. After the screen mask, such as the metal mask, is positioned on the gate insulating layer 113, a conductive organic polymer, such as polyethylene dioxythiophene (PEDOT), may be coated using a coating method, or may be printed using an inject-printing method, thereby forming the gate line 112 and the gate electrode 112a. For example, the organic TFT may include ITO-based source and drain electrodes 115a and 115b, a LCPBC or Pentacene-based semiconductor layer 114, an organic insulating material-based gate insulating layer 113, and an organic polymer-based gate electrode 112a. Subsequently, an organic material, such as BCB or acrylic material, may be deposited along an entire surface of the substrate 111 including the gate line 112, and a passivation layer 116 may be formed thereupon. Accordingly, the TFT array substrate including the organic TFT may function as a switching device.

Figure 4:
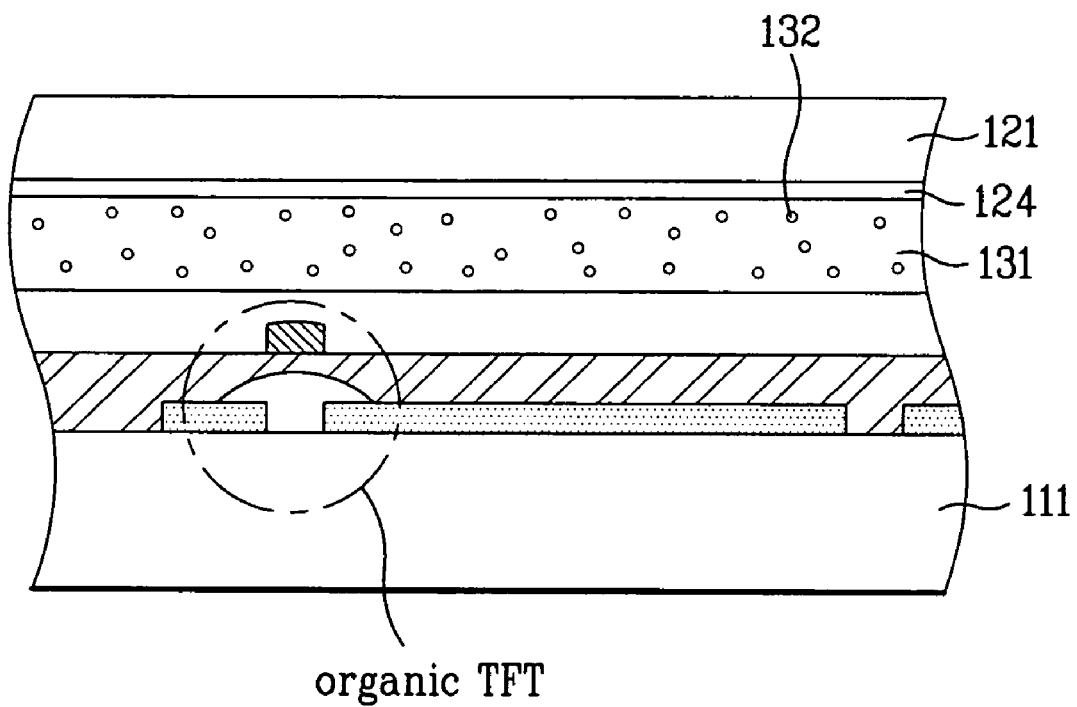
FIG. 4 is a cross sectional view of an exemplary LCD device according to the present invention.

FIG. 4 is a cross sectional view of an exemplary LCD device according to the present invention. In FIG. 4, an LCD device may includes a lower substrate 111, an upper substrate 121, and a liquid crystal layer 131. As shown in FIGS. 3A-3F, the lower substrate 111 may include a data line 115, a source electrode 115a, a drain electrode 115b, a pixel electrode 117, an island-shaped semiconductor layer 114, a gate insulating layer 113, a gate line 112, a gate electrode 112a, and a passivation layer 116. The island-shaped semiconductor layer 114 may overlap the source and drain electrodes 115a and 115b, and the gate insulating layer 113 may be formed along an entire surface of the lower substrate 111 including the semiconductor layer 114. The gate line 112 and the gate electrode 112a may be formed on the gate insulating layer 113, and the passivation layer 116 may be formed along an entire surface of the lower substrate 111 including the gate line 112. Next, the upper substrate 121 may be positioned opposite to the lower substrate 111, and the liquid crystal layer 131, such as liquid crystal copolymer, may be formed between the two substrates 111 and 121.

For example, the semiconductor layer 114 may be formed of an organic material, such as liquid crystalline polyfluorene block copolymer (LCPBC) or pentacene, and the gate insulating layer 113 may be formed of an organic material, such as benzocyclobutene (BCB) or acrylic material. In addition, the gate line 112 and the gate electrode 115a may be formed of organic polymer, such as polyethylene dioxythiophene (PEDOT), and the passivation layer 116 may be formed of an organic material, such as BCB or acrylic material.

Within a unit pixel region defined by crossing the gate and data lines 112 and 115, an organic thin film transistor (TFT) may be formed as a deposition layer of the source electrode 115a, the drain electrode 115b, the semiconductor layer 114, the gate insulating layer 113, and the gate electrode 115a. In the organic TFT, the semiconductor layer 114, the gate insulating layer 113. and the gate electrode 115a may be formed of organic material. Since the semiconductor layer 114 may be formed of the organic material, surfaces of the source and drain electrodes 115a and 115b may be treated with a hydrophilic plasma, thereby improving adhesiveness of the semiconductor layer 114 to the source and drain electrodes 115a and 115b. In addition, during the hydrophilic plasma treatment of the source and drain electrodes 115a and 115b, the data line 115 and the pixel electrode 117 may be treated together with hydrophilic plasma, thereby improving adhesiveness to the gate insulating layer 113.

In FIG. 4, a sealant (not shown) may be formed as a frame pattern except a liquid crystal injection inlet on any one of the lower substrate 111 having an organic TFT and the upper substrate 121 having a transparent conductive material, such as an ITO-based common electrode 124. Then, the lower and upper substrates 111 and 121 may be bonded to each other. Accordingly, the common electrode 124 may be formed along an entire surface of the upper substrate 121 corresponding to a pixel electrode 117 of the lower substrate 111.

Then, a PDLC layer 131 may be formed using a method of dispersing liquid crystal droplets 132 between the two substrates 111 and 121, and the liquid crystal injection inlet may be sealed, thereby completing an LCD device. In addition to the PDLC layer 131, a polymer dispersion type liquid crystal material, such as NCAP or PNLC, may be used. In addition, the upper substrate 121 may be formed of a flexible plastic or film.

When a voltage is not supplied to the ITO layer of the LCD device, liquid crystal directors positioned randomly within the liquid crystal material may have predetermined directional angles, whereby light incident onto the liquid crystal layer may be scattered. When a voltage is supplied to the ITO layer, the liquid crystal directors may be positioned along the same direction as an electric field, whereby light may be transmitted through the liquid crystal material. According to the present invention, the process of patterning the data line and the pixel electrode may use a mask, thereby allowing for use of a low-mask technology and reducing a total number of masks.

Figure 5A:
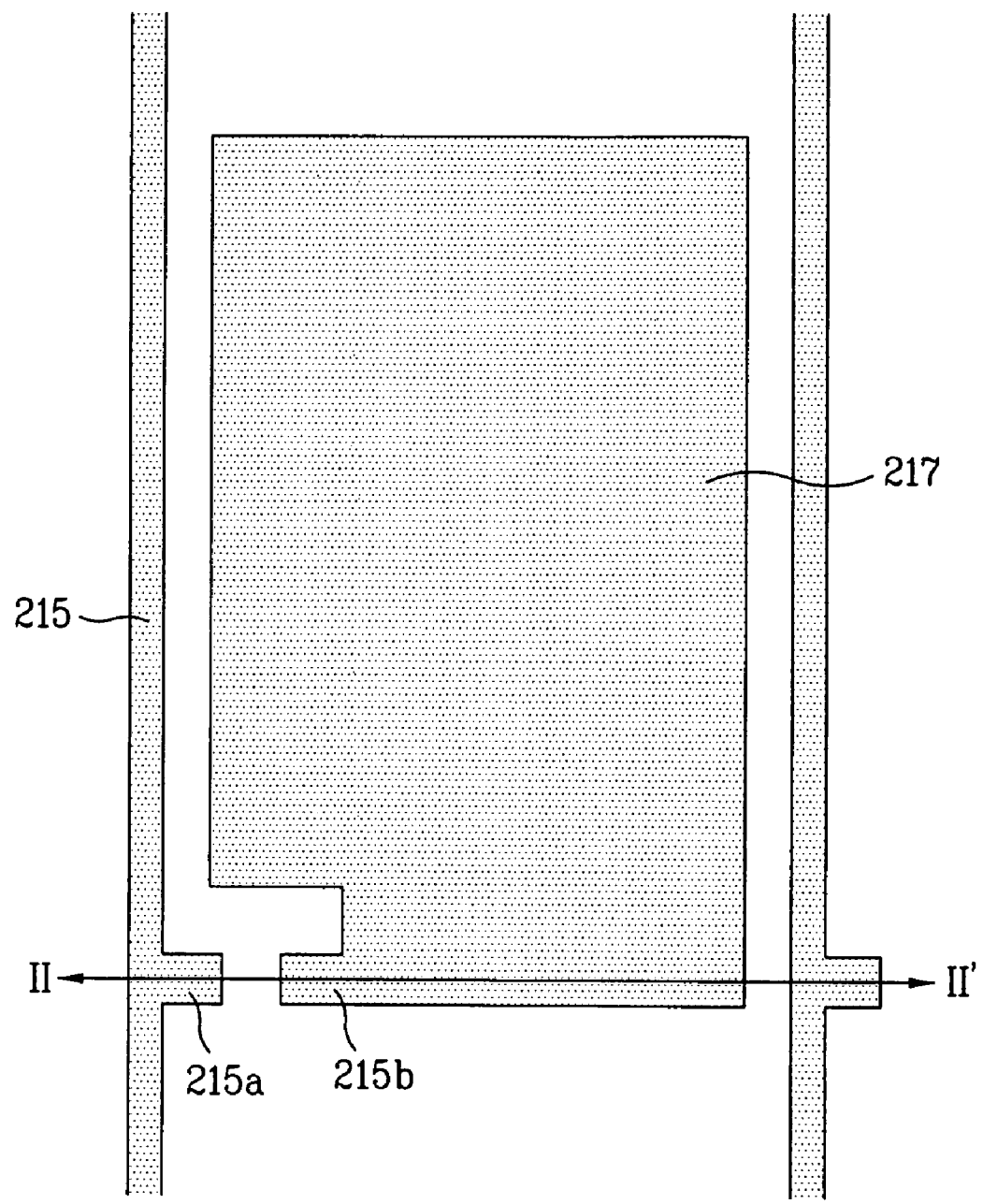
FIG. 5A is a plan view of another exemplary TFT array substrate according to the present invention.
Figure 5B:
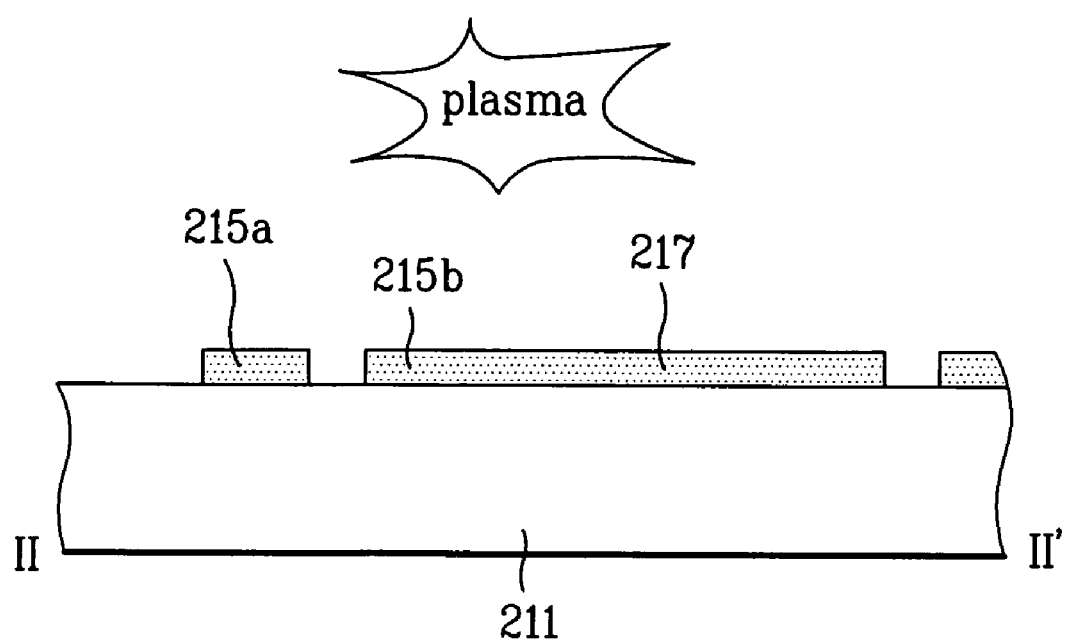
FIG. 5B is a cross sectional view along II-II' of FIG. 5A according to the present invention.

FIGS. 5A to 5F are plan and cross sectional views of another exemplary method of fabricating a TFT array substrate according to present invention. In FIGS. 5A and 5B, a transparent conductive material, such as ITO, may be deposited onto a glass or transparent plastic lower substrate 211 in a vacuum state, and a photoresist (not shown) may be deposited thereon. After a mask having a predetermined pattern is positioned above the photoresist, exposure and developing processes may be performed, thereby patterning the photoresist. Then, the exposed ITO layer may be selectively etched by using the patterned photoresist as a mask, thereby simultaneously forming a data line 215, a source electrode 215a, a drain electrode 215b, and a pixel electrode 217. In addition, the data line 215 may be formed with the source electrode 215a, and the pixel electrode 217 may be formed with the drain electrode 215b.

Then, surfaces of the data line 215, the source electrode 215a, the drain electrode 215b, and the pixel electrode 217 may undergo a plasma treatment, whereby the ITO layer may have hydrophobic/hydrophilic properties to the organic material. For example, the mixing gas of $CF_4$ or $O_2$ may be used for the plasma treatment. If the mixing gas has a significant amount of $CF_4$, the ITO layer may have the hydrophobic properties to the organic material.

Figure 5C:
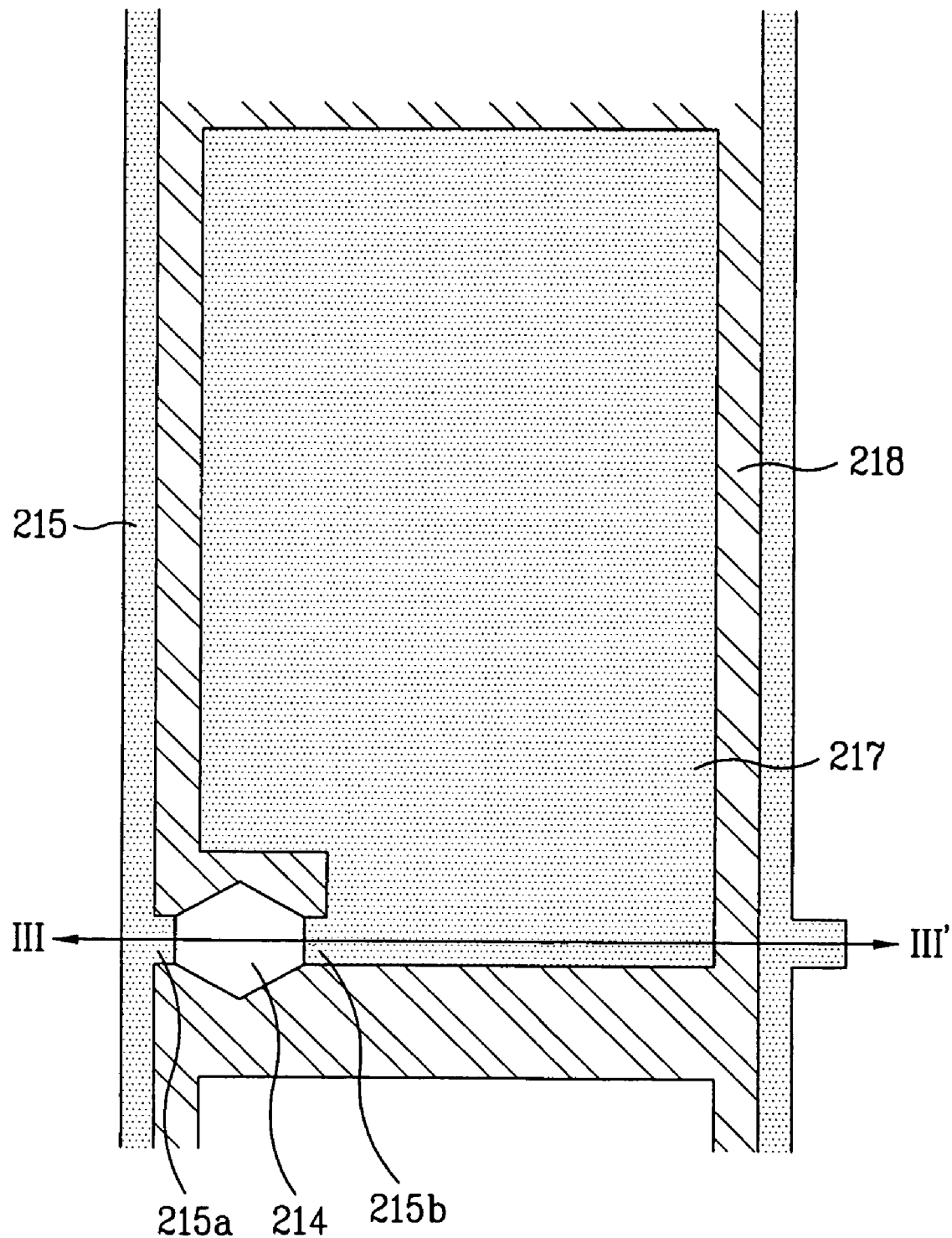
FIG. 5C is, a plan view of another exemplary TFT array substrate according to the present invention.
Figure 5D:
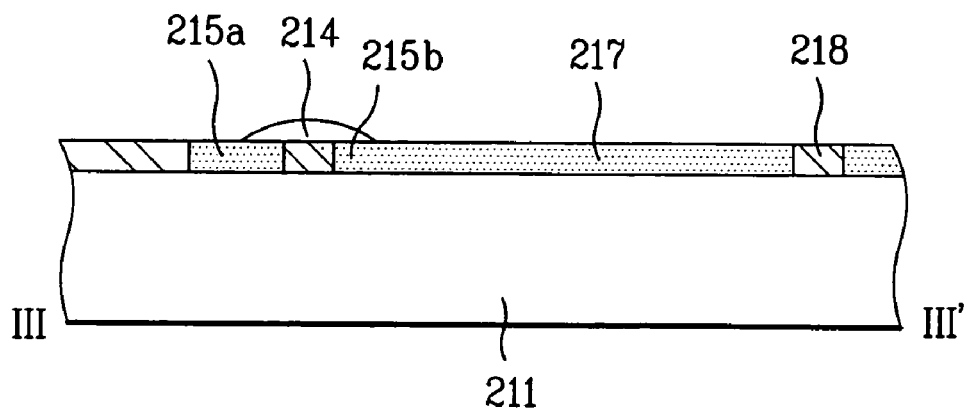
FIG. 5D is a cross sectional view along II-II' of FIG. 5C according to the present invention.

In FIGS. 5C and 5D, an organic insulating layer 218 may be formed during a spin coating method or an inject-printing method using an organic polymer, such as BCB or acrylic material. The organic insulating layer 218 may fill intervals between a drain line layer and the pixel electrode 217. Accordingly, the data line 215, the source electrode 215a, the drain electrode 215b, and the pixel electrode 217, which may all be formed of ITO, may have the hydrophobic properties. Thus, the insulating layer 218 of the organic material may not be adhered to the surfaces of the data line 215, the source electrode 215a, the drain electrode 215b, and the pixel electrode 217.

Next, the island-shaped semiconductor layer 214 may be formed to overlap the source and drain electrodes 215a and 215b using a printing method including a screen mask. By forming the semiconductor layer 214 using the printing method, the semiconductor layer 214 may have improved adhesiveness without using photolithographic processes having a mask at a low temperature. For example, the screen mask may have open areas based upon a pattern of the semiconductor layer 214. In addition, the semiconductor layer 214 may be formed of the organic material, such as LCPBC or Pentacene. Thus, the semiconductor layer 214 may be adhered to the insulating layer 218 of the organic material.

Figure 5E:
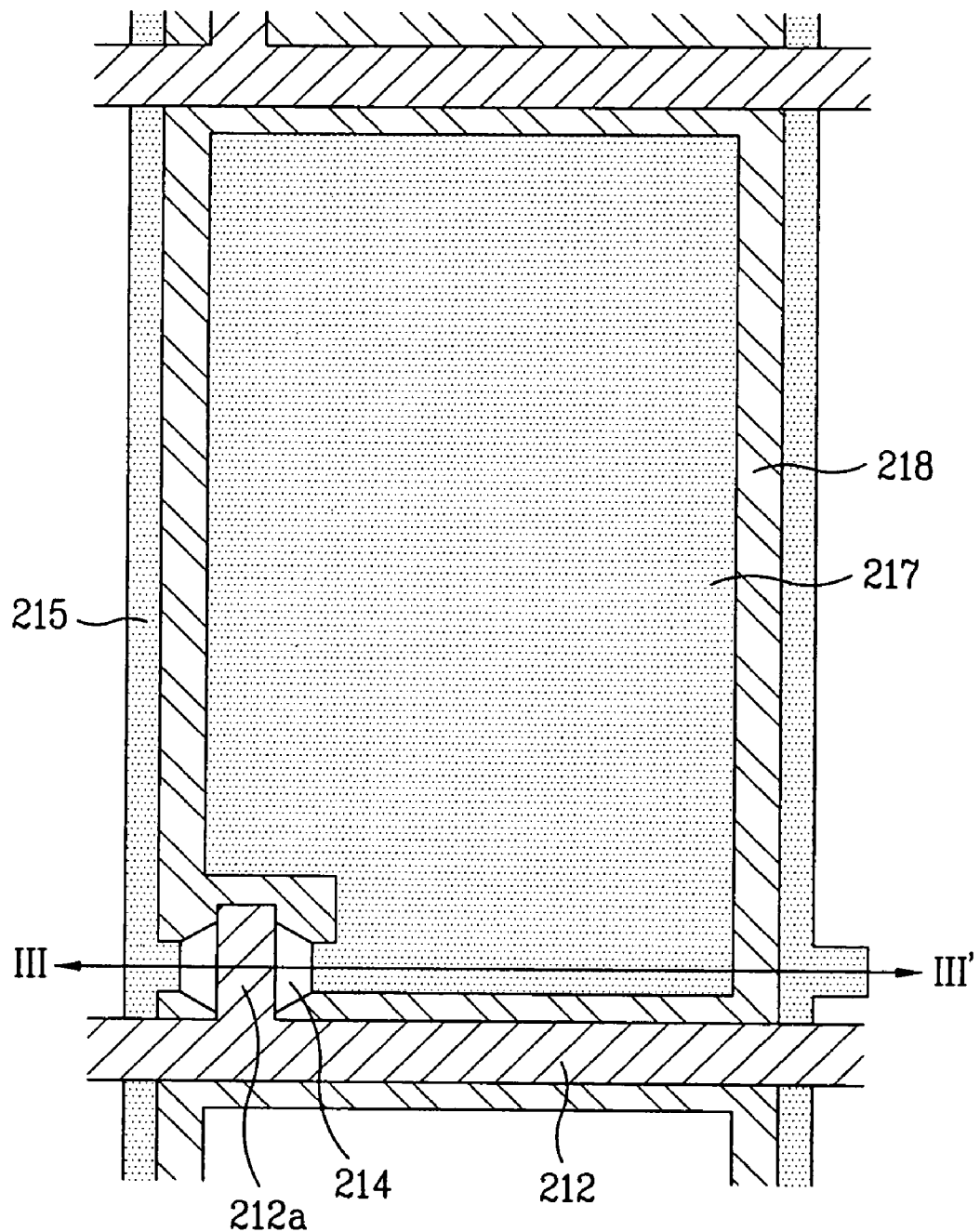
FIG. 5E is a plan view of another exemplary TFT array substrate according to the present invention.
Figure 5F:
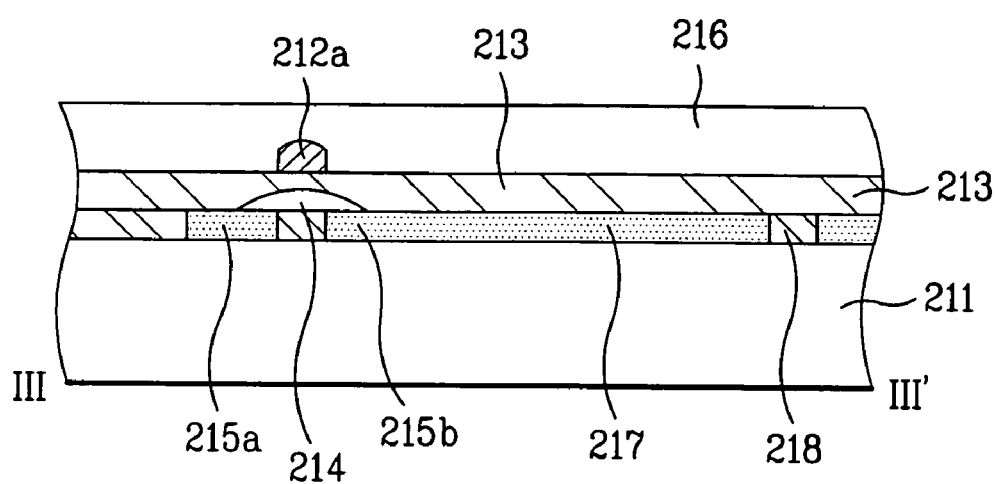
FIG. 5F is a cross sectional view along II-II' of FIG. 5E according to the present invention.

In FIGS. 5E and 5F, an gate insulating layer 213 may be formed during a method of depositing an organic material, such as BCB or acrylic material, along an entire surface of the substrate 211 including the semiconductor layer 214 at low temperatures. Then, a gate line 212 and a gate electrode 212a may be formed during a method of printing a conductive organic polymer, such as PEDOT, during a coating method using a screen mask or during an inject-printing method. Accordingly, the deposition layer of the source and drain electrodes 215a and 215b, the semiconductor layer 214, the gate insulating layer 213, and the gate electrode 212a may be formed as an organic TFT. Then, a passivation layer 216 may be formed during a method of depositing an organic material, such as BCB or acrylic material, along an entire surface of the substrate 211 including the gate line 212. Thus, a TFT array substrate having an organic TFT may be formed, wherein the organic TFT may function as a switching device.

Figure 6:
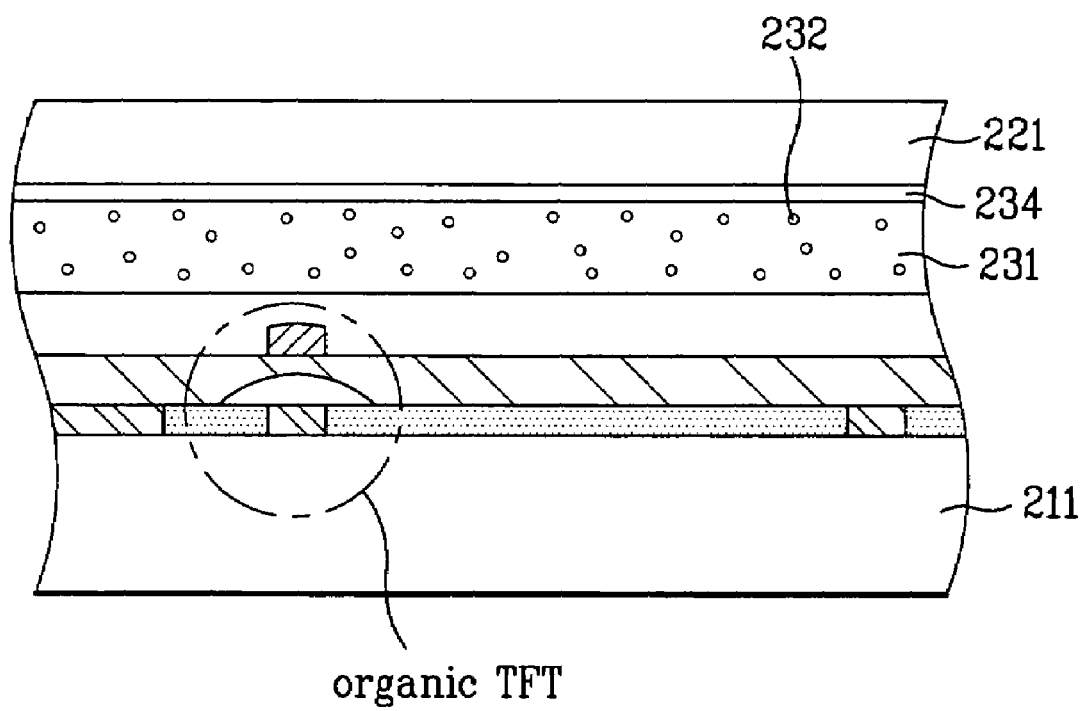
FIG. 6 is a cross sectional view of another exemplary LCD device according to the present invention.

FIG. 6 is a cross sectional view of another exemplary LCD device according to the present invention. In FIG. 6, an LCD device may include the lower substrate 211, the upper substrate 221, and a liquid crystal layer 231. As shown in FIGS. 5A-5F, the data line 215, the source electrode 215a, the drain electrode 215b, and the pixel electrode 217 may be formed of the same layer on the lower substrate 211. In addition, an organic insulating layer may be interlaid between the data line 215 and the source electrode 215a, between the source electrode 215a and the drain electrode 215b, and between the drain electrode 215b and the pixel electrode 217. In addition, surfaces of the data line 215, the source electrode 215a, the drain electrode 215b, and the pixel electrode 217 may be treated to have hydrophobic properties. Then, an island-shaped semiconductor layer 214 may be formed to overlap the source and drain electrodes 215a and 215b, and a gate insulating layer 213 may be formed along an entire surface of the lower substrate 211 including the semiconductor layer 214. Next, a gate line 212 and a gate electrode 215a may be formed on the gate insulating layer 213, and a passivation layer 216 may be formed along an entire surface of the lower substrate 211 including the gate line 212. Then, the upper substrate 221 may be positioned opposite to the lower substrate 211, and the liquid crystal layer 231, such as a liquid crystal copolymer, may be formed between the lower and upper substrates 211 and 221.

For example, the semiconductor layer 214 may be formed of an organic material of LCPBC or Pentacene, and the gate insulating layer 213 and the passivation layer 216 may be formed of an organic material such, as BCB or acrylic material. In addition, the gate line 212 and the gate electrode 215a may be formed of an organic polymer, such as PEDOT. Accordingly, a deposition layer for forming the source electrode 215a, the drain electrode 215b, the semiconductor layer 214, the gate insulating layer 213, and the gate electrode 215a may function as an organic thin film transistor TFT.

Accordingly, since the semiconductor layer 214 may be formed of organic material, the semiconductor layer 214 may not adhere to the source and drain electrodes 215a and 215b, which may be formed of ITO. However, since the organic insulating layer 218 may be formed between the source electrode 215a and the drain electrode 215b, the semiconductor layer 214 may adhere to the organic insulating layer 218.

In addition, since surfaces of the data line 215, the source electrode 215a, the drain electrode 215b, and the pixel electrode 217 may be treated to become hydrophobic, residual substances may not remain on the surfaces of the source and drain electrodes 215a and 215b when coating the insulating layer 218. As a result, adhesiveness between the source/drain electrodes 215a/215b and the semiconductor layer 214 may be prevented from becoming deteriorated.

In FIG. 6, a sealant (not shown) may be formed as a frame pattern except at a liquid crystal injection inlet on any one of the lower substrate 211 having the organic TFT and the upper substrate 221 having a transparent conductive material, such as an ITO-based common electrode 234. Then, the lower and upper substrates 211 and 221 may be bonded to each other. Then, a PDLC layer 231 may be formed during a method of dispersing liquid crystal droplets 232 between the two substrates 211 and 221, and the liquid crystal injection inlet may be sealed. In addition to the PDLC layer 231, other types of liquid crystal copolymer materials may be used. For example, the upper substrate 221 may be formed of a flexible plastic substrate or a film, wherein the process of patterning the data line and the pixel electrode may use a mask, thereby making it suitable for reducing the total number of masks required to fabricating the LCD.

Figure 7A:
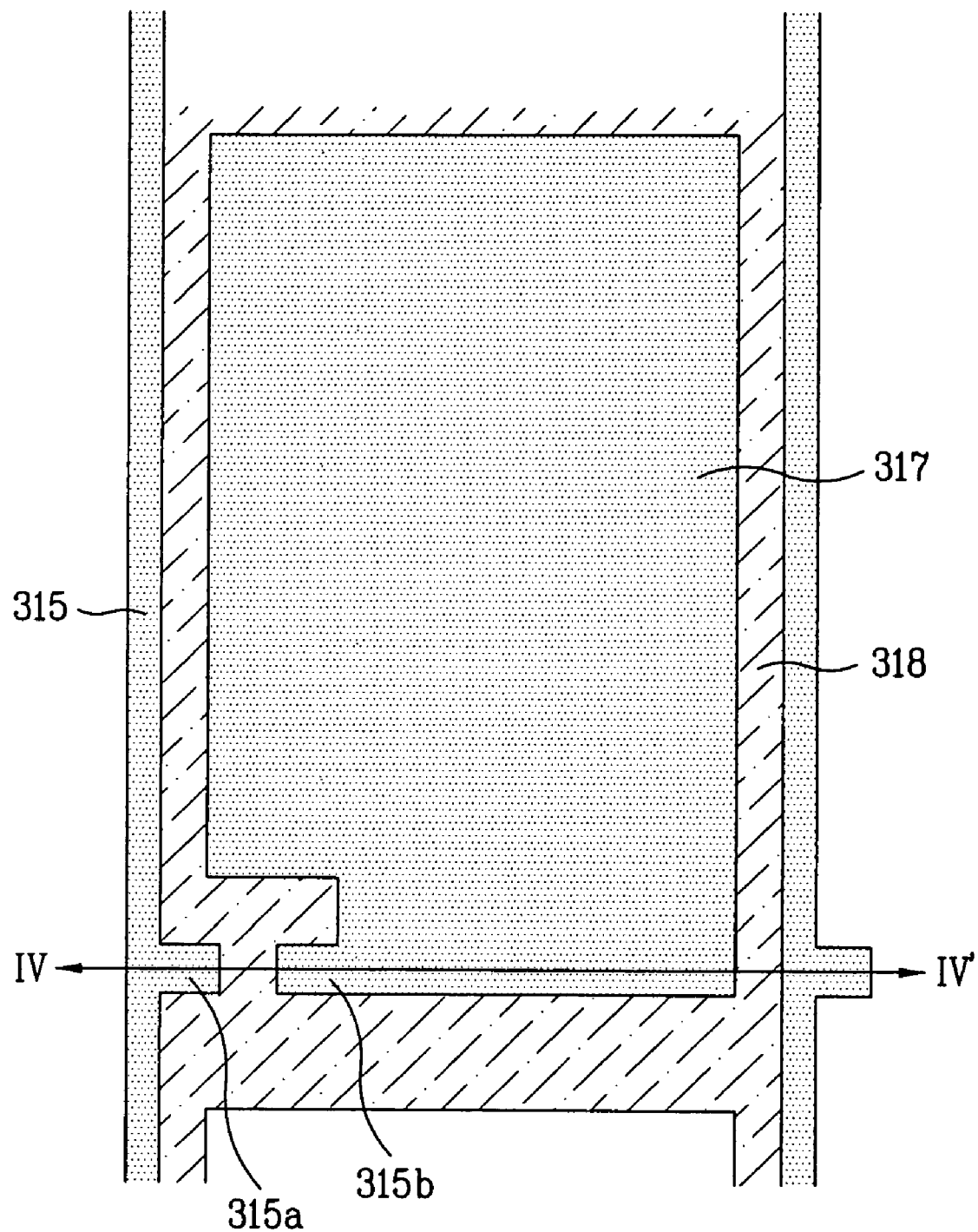
FIG. 7A is a plan view of another exemplary TFT array substrate according to the present invention.
Figure 7B:
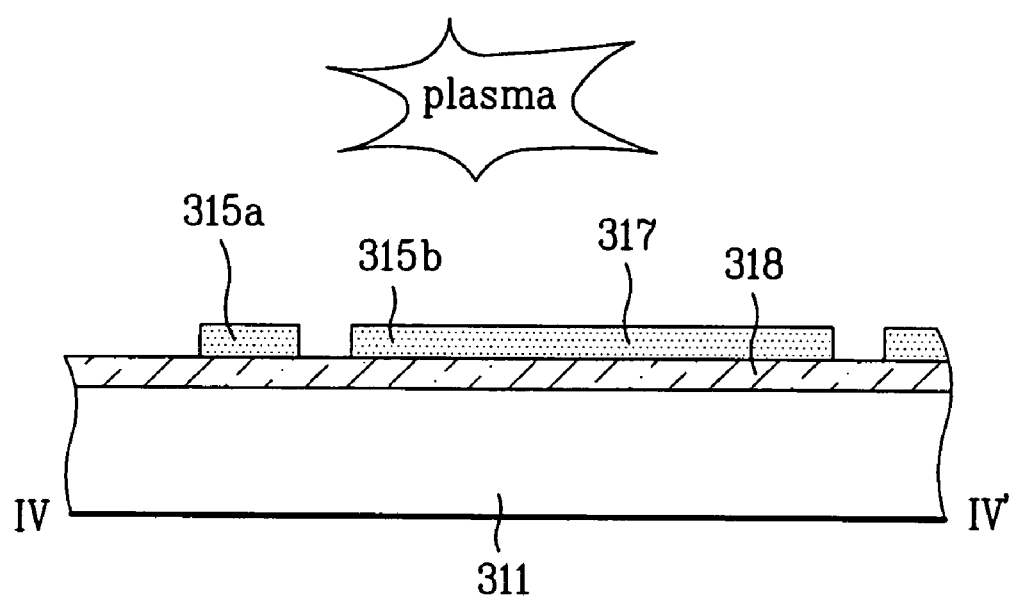
FIG. 7B is a cross sectional view along IV-IV' of FIG. 7A according to the present invention.

FIG. 7A to 7F are plan and cross sectional views of another exemplary method of fabricating a TFT array substrate according to the present invention. In FIGS. 7A and 7B, a buffer layer 318 may be formed along an entire surface of a lower substrate 311, wherein the lower substrate 311 may be formed of glass or transparent plastic. The buffer layer 318 may protect the lower substrate 311 during subsequent patterning processes and may improve an adhesiveness to a subsequently-formed semiconductor layer 314 (in FIG. 7D). The buffer layer 318 may be formed during a method of depositing an inorganic material, such as $SiO_2$, or depositing organic material. Then, a transparent conductive material, such as ITO, may be deposited on the buffer layer 318 in a vacuum state, and patterned by a photolithographic process using a mask, thereby simultaneously forming a data line 315, a source electrode 315a, a drain electrode 315b, and a pixel electrode 317. In addition, the data line 315 may be formed with the source electrode 315a, and the drain electrode 315b may be formed with the pixel electrode 317.

Then, an inorganic material of the buffer layer 318, the data line 315, the source electrode 315a, the drain electrode 315b, and the pixel electrode 317 may be provided with hydrophilic properties to organic material by a plasma treatment. For example, a mixing gas of $CF_4$ or $O_2$ may be used for the plasma treatment. If the mixing gas has significant amounts of the $O_2$, the ITO layer may have improved hydrophilic properties to the organic material. Alternatively, if the mixing gas has significant amounts of the $CF_4$, the ITO layer may have the hydrophobic properties to the organic material. In addition, if the mixing gas has significant amounts of $SiO_2$, the buffer layer 318 may be the hydrophilic properties to the organic material. Alternatively, if the mixing gas has significant amounts of the $CF_4$, the buffer layer may have the hydrophobic properties to the organic material.

Figure 7C:
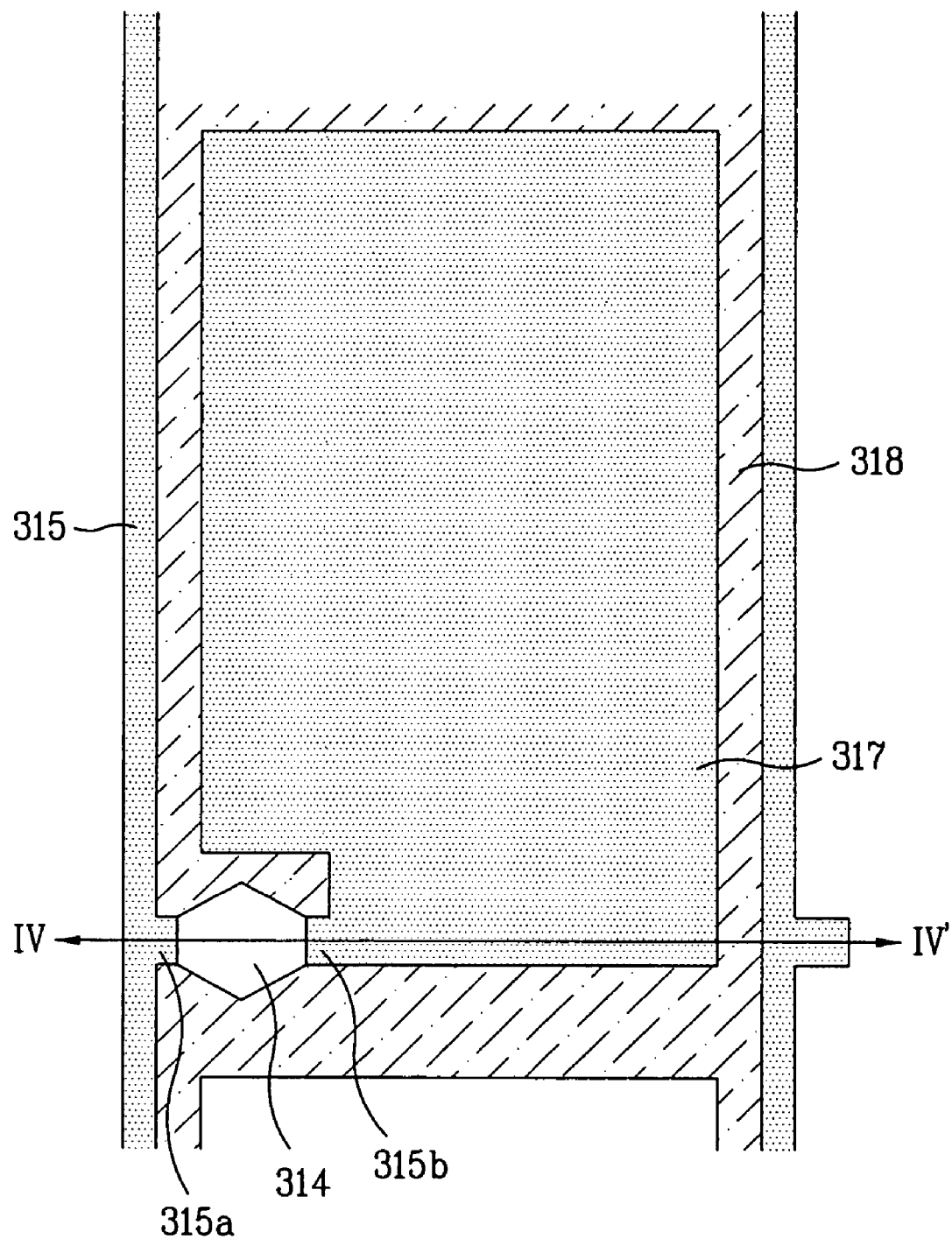
FIG. 7C is a plan view of another exemplary TFT array substrate according to the present invention.
Figure 7D:
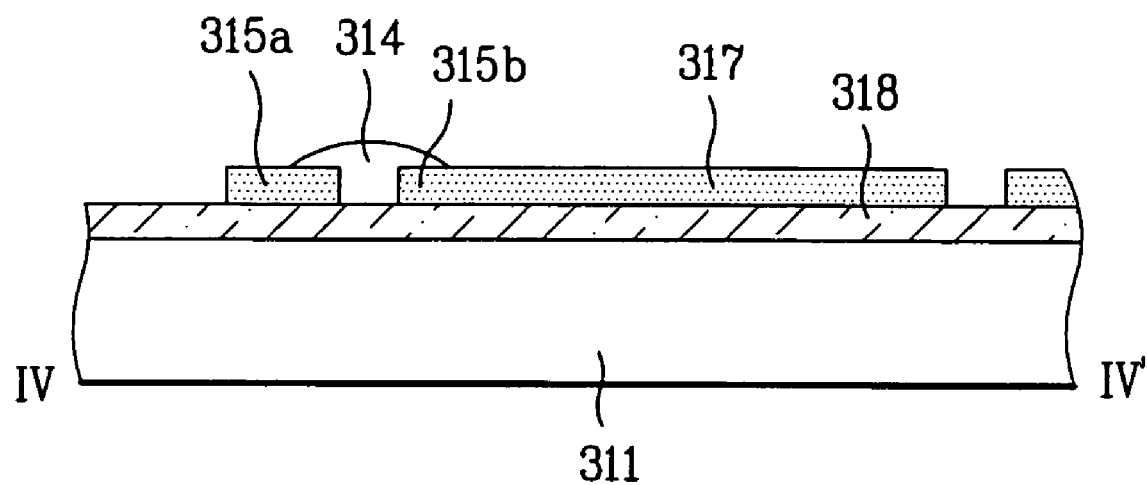
FIG. 7D is a cross sectional view along IV-IV' of FIG. 7C according to the present invention.

In FIGS. 7C and 7D, a semiconductor layer 314 may formed to overlap the source and drain electrodes 315a and 315b during a coating method using a screen mask or during an inject-printing method. For example, the semiconductor layer 314 may be formed of LCPBC or Pentacene. Then, the buffer layer 318, the source electrode 315a, and the drain electrode 315b may undergo a plasma treatment to have the hydrophilic properties to the organic material, thereby improving adhesiveness to the semiconductor layer 314 of the organic material. By forming the semiconductor layer 314 during the inject-printing method, the semiconductor layer 314 may have improved adhesiveness without using a photolithographic process using a mask at low temperatures.

Figure 7E:
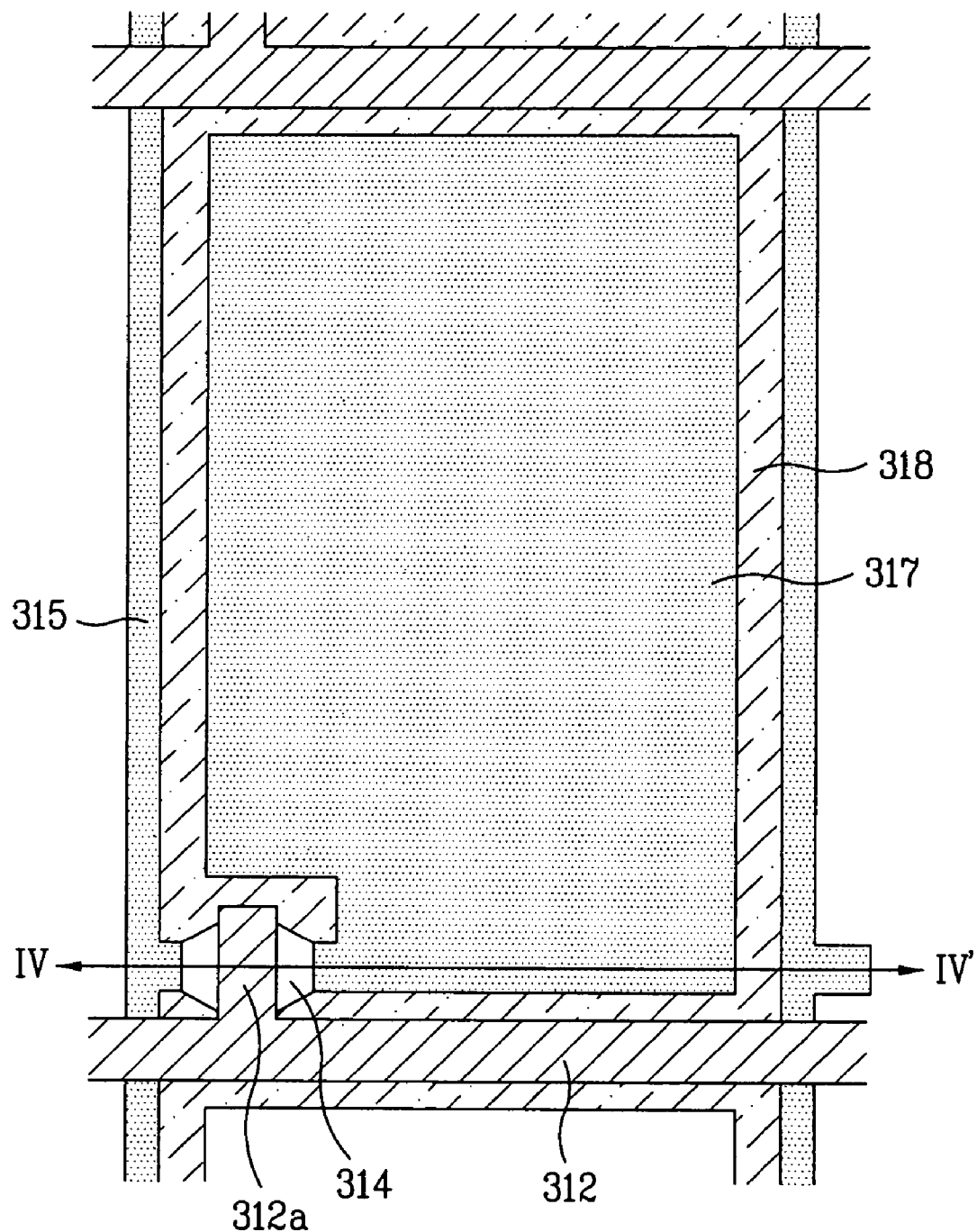
FIG. 7E is a plan view of another exemplary TFT array substrate according to the present invention.
Figure 7F:
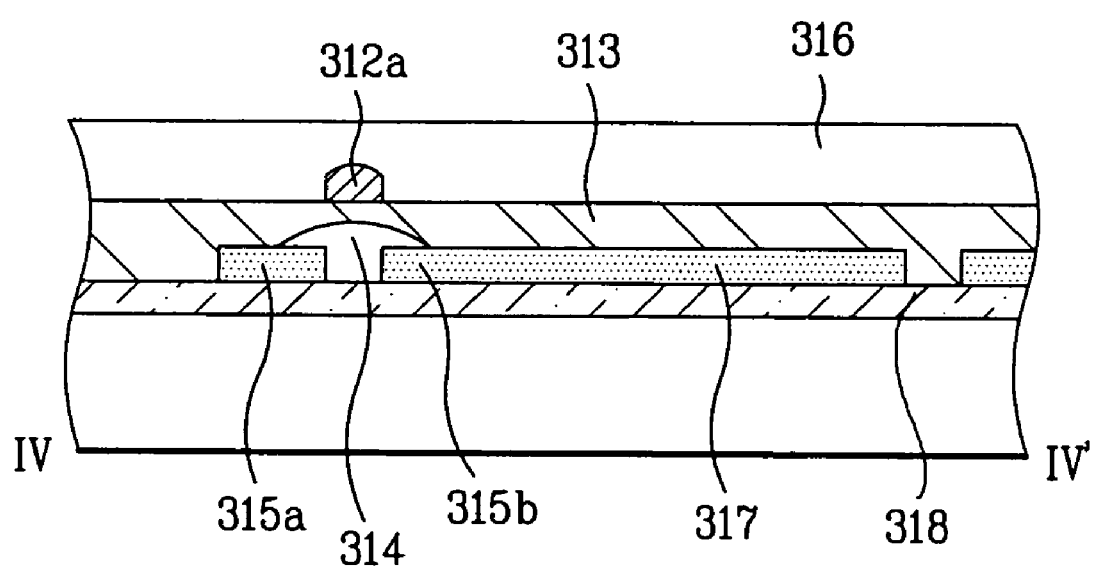
FIG. 7F is a cross sectional view along IV-IV' of FIG. 7E according to the present invention.

In FIGS. 7E and 7F, a gate insulating layer 313 may be formed during a method of depositing an organic material, such as BCB or acrylic material, along an entire surface of the substrate 311 including the semiconductor layer 314. Then, a gate line 312 and a gate electrode 312a may be formed during a method of printing a conductive organic polymer, such as PEDOT, using a screen mask or a printing method. Accordingly, the deposition layer of the source and drain electrodes 315a and 315b, the semiconductor layer 314, the gate insulating layer 313, and the gate electrode 312a may be formed as an organic TFT. Then, a passivation layer 316 may be formed during a method of depositing an organic material, such as BCB or acrylic material, along an entire surface of the substrate 311 including the gate line 312, thereby forming a TFT array substrate having an organic TFT functioning as a switching device.

Figure 8:
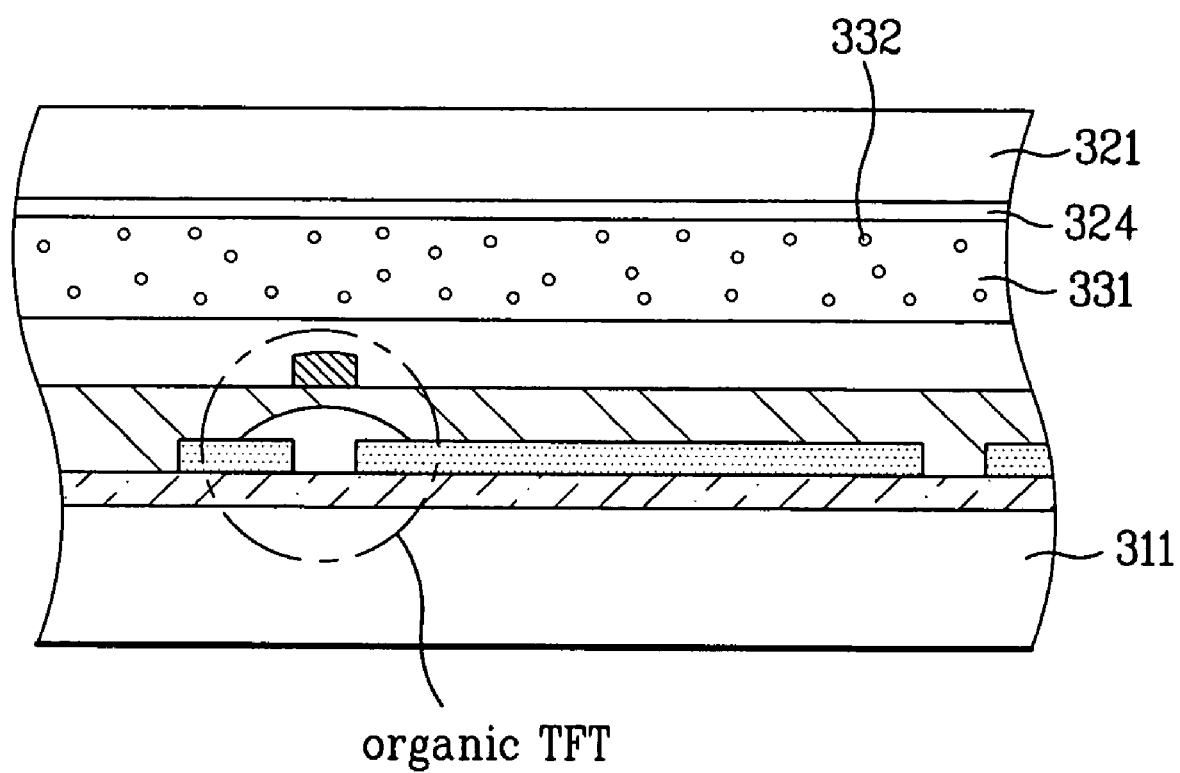
FIG. 8 is a cross sectional view of another exemplary LCD device according to the present invention.

In FIG. 8, the LCD device may include a lower substrate 311, an upper substrate 321, and a liquid crystal layer 331. As shown in FIGS. 7A-7F, a buffer layer 318 may be formed along an entire surface of the lower substrate 311. Then, a data line 315, a source electrode 315a, a drain electrode 315b, and a pixel electrode 317 may be formed on the same layer of the lower substrate 311, and an island-shaped semiconductor layer 314 may be formed to overlap the source and drain electrodes 315a and 315b. Next, a gate insulating layer 313 may be formed along an entire surface of the lower substrate 311 including the semiconductor layer 314, and a gate line 312 and a gate electrode 312a may be formed on the gate insulating layer 313. Then, a passivation layer 316 may be formed along an entire surface of the lower substrate 311 including the gate line 313. Next, the upper substrate 321 may be positioned opposite to the lower substrate 311, and the liquid crystal layer 331, such as a liquid crystal copolymer, may be formed between the lower and upper substrates 311 and the 321.

For example, the semiconductor layer 314 may be formed of an organic material, such as LCPBC or Pentacene, and the gate insulating layer 313 and the passivation layer 316 may be formed of an organic material, such as BCB or acrylic material. In addition, the gate line 321 and the gate electrode 315a may be formed of organic polymer, such as PEDOT. As a result, an organic thin film transistor TFT may be formed of a deposition layer of the source electrode 315a, the drain electrode 315b, the semiconductor layer 314, the gate insulating layer 313, and the gate electrode 312a.

Since the semiconductor layer 314 and the gate insulating layer 313 may be formed of organic material, surfaces of the data line 315, the source electrode 315a, the drain electrode 315b, and the pixel electrode 317, which may be formed of the ITO layer, may be treated with a hydrophilic plasma, whereby the semiconductor layer 314 and the gate insulating layer 313 may be adhered to surfaces of the data line 315, the source electrode 315a, the drain electrode 315b, and the pixel electrode 317.

In addition, the buffer layer 318 may be formed of inorganic material, such as $SiO_2$, or of organic material. When the buffer layer is formed of the inorganic material, a hydrophilic plasma treatment may be performed on the buffer layer 318, as well as on the surfaces of the data line 315, the source electrode 315a, the drain electrode 315b, and the pixel electrode 317, thereby improving adhesiveness to the semiconductor layer 314 of the organic material.

In FIG. 8, a sealant (not shown) may be formed on any one of the lower substrate 311 having the organic TFT and the upper substrate 321 having a transparent conductive material, such as an ITO-based common electrode 324. Then, the lower and upper substrates 311 and 321 may be bonded to each other. Then, a PDLC layer 331 may be formed during a method of dispersing liquid crystal droplets 332 between the two substrates 311 and 321, and a liquid crystal injection inlet may be sealed, thereby forming an LCD device. In addition, the lower substrate 311 or the upper substrate 321 may be formed of a transparent material, such as glass. Alternatively, the lower or upper substrate may be formed of a flexible plastic substrate or a film.

According to the present invention, a process of patterning a data line and a pixel electrode may require using of a mask, thereby reducing a total number of masks used to fabricate an LCD device and reducing fabrications cost and time. In addition, since a plasma treatment may be performed to surfaces of an ITO layer, a work function of the ITO layer may be changed to control an adhesiveness to organic material. In addition, since surfaces of the ITO layer may be cleaned, a surface area of the ITO layer may increase for chemical binding.

According to the present invention, a semiconductor layer and a gate line layer may be formed during an inject-printing method or a coating method using a metal mask, thereby improving productivity by simplifying fabrication processes. In addition, by using a liquid crystal material is formed of PDLC, processes for forming polarizers and rubbing processes may be omitted, thereby reducing fabrication costs.

It will be apparent to those skilled in the art that various modifications and variations can be made the thin film transistor device, LCD device, and method of fabricating an LCD device of the present invention without departing from the scope or spirit of the invention. Thus, it is intended that the present invention covers the modifications and variations of this invention provided they come within the scope of the appended claims and their equivalents.

What is claimed is:

1. A method of fabricating a liquid crystal display device, comprising:

forming a data line and a pixel electrode on a lower substrate using transparent conductive material, wherein the data line includes a source electrode and the pixel electrode includes a drain electrode;

forming a semiconductor layer overlapping portions of the data line and the pixel electrode on the data line and the pixel electrode;

forming a gate insulating layer covering the data line, the pixel electrode and the semiconductor layer on the lower substrate;

forming a gate line on the gate insulating layer;

forming a passivation layer covering the gate line on the gate insulating layer;

bonding the lower and upper substrates to each other; and forming a liquid crystal layer between the lower and upper substrates, wherein surfaces of the data line, including the source electrode, and the pixel electrode, including the drain electrode, are treated to have hydrophilic properties and then all the semiconductor layer, the gate insulating layer, the gate electrode and the passivation layer are formed of organic material.

2. The method according to claim 1, wherein surfaces of the data line and the pixel electrode are treated to have hydrophilic properties.

3. The method according to claim 2, wherein the surfaces of the data line and the pixel electrode are treated with a plasma.

4. The method according to claim 3, wherein the plasma includes a mixing gas of $O_2$ or $CF_4$.

5. The method according to claim 1, wherein the semiconductor layer includes one of liquid crystalline polyfluorene block copolymer and pentacene.

6. The method according to claim 1, wherein the forming the semiconductor layer includes one of a printing method and a method using a screen mask.

7. The method according to claim 1, wherein the lower and upper substrates includes one of glass material, plastic material, and thin films.

8. The method according to claim 1, wherein the transparent conductive material includes one of indium-tin-oxide and indium-zinc-oxide.

9. The method according to claim 1, wherein the liquid crystal layer includes PDLC.

10. The method according to claim 1, wherein the organic material includes one of benzocyclobutene and acrylic material.

11. The method according to claim 1, wherein the gate line includes polyethylene dioxythiophene.

12. The method according to claim 1, wherein forming the gate line includes one of a printing method and a method using a screen mask.

13. A method of fabricating a liquid crystal display device, comprising:

forming a data line and a pixel electrode on a lower substrate using transparent conductive material, wherein the data line includes a source electrode and the pixel electrode includes a drain electrode;

forming an insulating layer between lateral portions of the data line and the pixel electrode on the data line and the pixel electrode;

forming a semiconductor layer to overlap the data line and the pixel electrode;

forming a gate insulating layer covering the data line, the pixel electrode and the semiconductor layer on the lower substrate;

forming a gate line on the gate insulating layer;

forming a passivation layer covering the gate line on the gate insulating layer;

bonding the lower substrate to an upper substrate; and forming a liquid crystal layer between the lower and upper substrates, wherein surfaces of the data line, including the source electrode, and the pixel electrode, including the drain electrode, are treated to have hydrophilic properties and then all the insulating layer, the semiconductor layer, the gate insulating layer, the gate electrode and the passivation layer are formed of organic material.

14. The method according to claim 13, further comprising treating surfaces of the data line and the pixel electrode to have hydrophobic properties.

15. The method according to claim 14, wherein the data line and the pixel electrode are treated using a plasma.

16. The method according to claim 15, wherein the plasma includes a mixing gas of $O_2$ or $CF_4$.

17. The method according to claim 13, wherein the insulating layer includes one of BCB and acrylic material.

18. The method according to claim 13, wherein the forming of the insulating layer includes one of a spin coating method and a printing method.

19. The method according to claim 13, wherein the semiconductor layer includes one of liquid crystalline polyfluorene block copolymer and pentacene.

20. The method according to claim 19, wherein the forming the semiconductor layer includes one of a printing method and a method using a screen mask.

21. The method according to claim 13, wherein the lower and upper substrates include glass material, plastic material, and thin films.

22. The method according to claim 13, wherein the liquid crystal layer includes PDLC.

23. The method according to claim 13, wherein the gate insulating layer includes one of BCB and acrylic material.

24. The method according to claim 13, wherein the gate line includes polyethylene dioxythiophene.

25. The method according to claim 24, wherein the forming the gate line includes one of a printing method and a method using a screen mask.

* * * * *